Figure 1:
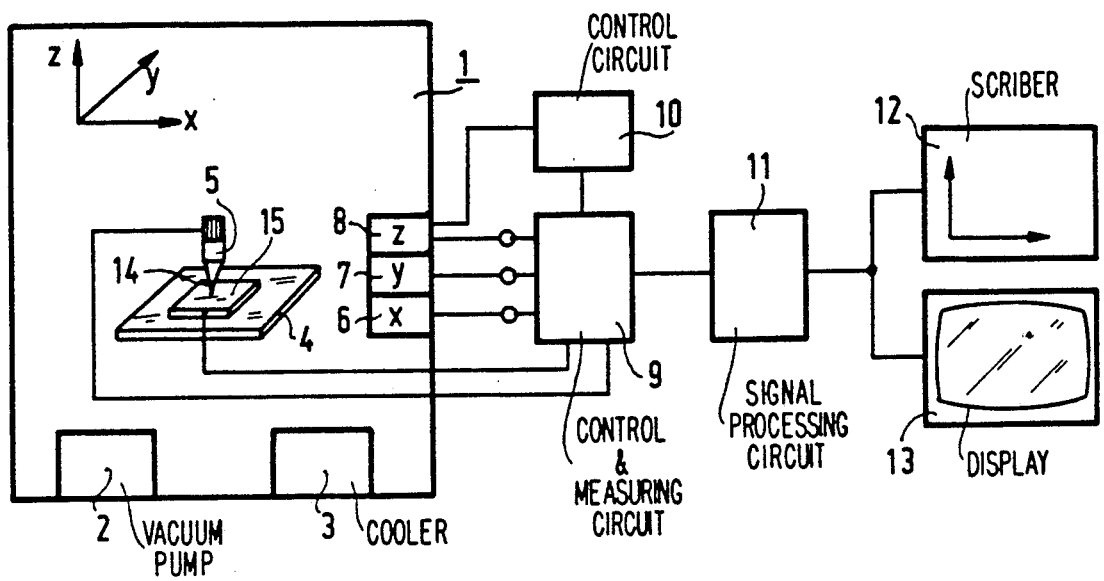

United States Patent [19]

Van Loenen

[11] Patent Number: 5,038,322

[45] Date of Patent: Aug. 6, 1991

[54] METHOD OF AND DEVICE FOR SUB-MICRON PROCESSING A SURFACE

[75] Inventor: Evert J. Van Loenen, Eindhoven, Netherlands

[73] Assignee: U.S. Philips Corporation, New York, N.Y.

[21] Appl. No.: 306,367

[22] Filed: Feb. 3, 1989

[30] Foreign Application Priority Data

Sep. 21, 1988 [NL] Netherlands .................. 8802335

[51] Int. Cl.⁵ .................. G11C 11/34; G11C 13/00; G01N 23/00; G01N 23/225
[52] U.S. Cl. .................. 365/114; 365/151; 365/118; 250/306; 369/101
[58] Field of Search .............. 365/174, 117, 118, 127, 365/128, 215, 217, 151; 369/101; 358/347; 250/306, 307, 311

[56] References Cited

U.S. PATENT DOCUMENTS

| | | | |
|---|---|---|---|
| 4,013,968 | 3/1977 | Huelsman | 365/118 X |
| 4,068,218 | 1/1978 | Likuski | 365/118 X |
| 4,133,097 | 1/1979 | Levinthal | 365/128 X |
| 4,575,822 | 3/1986 | Quate | 365/126 X |
| 4,760,567 | 7/1988 | Crewe | 365/128 X |
| 4,764,818 | 8/1988 | Crew | 365/118 X |
| 4,820,977 | 4/1989 | Brust | 250/311 X |
| 4,831,614 | 5/1989 | Duerig et al. | 365/118 X |
| 4,868,395 | 9/1989 | Kasahara et al. | 250/492.2 |
| 4,904,091 | 5/1990 | Hansma et al. | 250/306 |
| 4,906,840 | 3/1990 | Zdeblick et al. | 250/306 |
| 4,939,363 | 7/1990 | Bando et al. | 250/311 X |

FOREIGN PATENT DOCUMENTS 1-116941 5/1989 Japan .................. 365/151

OTHER PUBLICATIONS

J. Vac. Sci. Tech nol. A 6(2) Mar./Apr. 1988 "Surface Modification in the Nanometer Range by the Scanning Tunneling Microscope", by Staufer et al.
IBM J. Res. Develop. vol. 30, No. 5 Sept. 1986 "Surface Modification With the Scanning Tunneling Microscope" by Abraham et al.

Primary Examiner—Alyssa H. Bowler
Attorney, Agent, or Firm—Paul R. Miller

[57] ABSTRACT

A method of and a device for sub-micron deforming a surface (15) is described, for example for the purpose of inscribing information. During scanning of the surface the tip (14) of a scanning tunneling microscope is held at a constant distance from the surface by means of a negative feedback control loop (18) which is controlled by a tunneling current (It) between the tip and the surface, and for forming a pit (21) in the surface (15). The control loop is deactivated and a tip height drive member (8) is energized by means a control voltage (Vpz) whose amplitude increases as a function of time and which has a predetermined final value, such that the tip is lowered into the material.

12 Claims, 2 Drawing Sheets

METHOD OF AND DEVICE FOR SUB-MICRON PROCESSING A SURFACE

The invention relates to a method of deforming a surface on a sub-micron scale by using a tip of a scanning tunneling microscope in which drive means for moving the tip in a scanning direction parallel to the surface are used to cause the tip to describe a path in a plane parallel to the surface in accordance with a desired machining pattern in the surface, said tip, when describing the path, being held at a reference level at a constant distance from the surface by means of a first electric control voltage applied to a tip height drive member, the voltage being supplied by a negative feedback control loop which is controlled by a tunneling current between the tip and the surface, which current results from a constant tunneling voltage applied between the surface and the tip. The invention also relates to a device for performing the method, to a method of inscribing information, to an apparatus for inscribing and reading information and to a record carrier inscribed by means of the method and the device.

The scanning tunneling microscope, also referred to as STM, has been used for some time with great success for studying surface structures on an atomic scale. This microscope has a very thin stylus of, for example, tungsten with a very fine tip. The stylus is mounted on a positioning device controlled, for example, by piezoelectric drive members with which the tip can be positioned very accurately in three mutually perpendicular directions, two of which (the X and Y directions) being located in a plane parallel to the surface to be examined and the third (the Z direction) being perpendicular to this surface. This makes it possible to position the tip with an accuracy of, for example 0.01 nm.

The Z- or tip-height drive member is an adjusting element with which the distance between the tip and the surface can be adjusted. This drive member may be connected to the stylus for moving the tip with respect to the surface, or it may be connected to a holder for the material to move this material with respect to the tip.

During scanning of the electrically conducting surface to be examined, the distance between the tip and this surface is maintained constant by means of the tip drive member for the Z direction. This drive member is controlled by a negative feedback loop. The distance between the tip and the surface is so small, for example of the order of 0.5 nm, that when a given voltage, or the so-called tunneling voltage, is applied between the tip and the surface, a so-called tunneling current starts flowing between these elements. This tunneling current is compared in a negative feedback loop or a servo-loop with a reference current which is determined by the desired distance between the tip and the surface. The signal thus obtained is used to correct the Z position of the tip in such a way that the tunneling current is equal to the reference current, and consequently the distance between the tip and the surface is equal to the desired distance. The movement of the tip with respect to the surface in a direction parallel to this surface for the purpose of scanning this surface is realized by means of the two other drive members, the X and Y drive members.

When studying surfaces, a signal which is proportional to the control signal for the tip height drive member for the Z direction is used to represent the variation in the distance between the tip and the surface as a function of the X and Y positions of the tip, and thus, obtain an image of the surface topology.

More recent are experiments in which the tip of a scanning tunneling microscope is also used to provide deformations in a surface. One of these experiments has been described in the Article "Surface Modification with the Scanning Tunneling Microscope" in "IBM Jour. Res. Dev." Vol. 30, no. 5, September 1986, pp. 492-9. In this experiment the tip was lowered onto a surface of gold, a soft material, and it was found that a surface deformation with a diameter of the order of 15 nm was produced. The Article further states that this technique can be potentially used in high-density storage systems and for micromachining purposes. However, in this method not only the desired deformation occurs but also an additional surface deformation occurs up to a distance of 70 nm from the center of the desired deformation. It is true that the additional deformation is not stable and will vanish but only after a relatively long time of the order of 17 minutes. If a plurality of deformations is to be provided close to one another on the surface, this means that a waiting time between successive deformations, which is inadmissibly long in practice, must be taken into account because it is impossible to work in the region of the unstable additional deformation. Moreover, it is not clear how a first deformation behaves if a second deformation is provided at a short distance therefrom, even after the additional deformation has disappeared. If information is to be inscribed in the surface in the form of discrete, spaced apart information areas, the long waiting time could be avoided by bringing the tip quickly to a location outside the additional deformation after a first information area has been provided and to provide the next information area at this location. However, optimum use is not made in this case of the potentially very high information density of a storage system using a scanning tunneling microscope.

It is an object of the present invention to provide a method which does not have the above-mentioned drawbacks and which provides the possibility of making surface deformations stable in time, in combination with materials hitherto not used for machining operations with a tunneling microscope. This method is characterized in that a surface deformation is brought about by interrupting the negative feedback control loop, in that the tip height drive member is energized with a second electric control voltage whose amplitude increases as a function of time and which has a predetermined final value as a result of which the tip is lowered from the reference level to a defined depth into the surface, thus producing a pit having an accurately defined geometry, in that subsequently the tip is retracted to above the surface and the negative feedback control is switched on loop again so that the tip is first brought to its reference level before a subsequent pit is provided.

In this way pits which are stable in time can be formed in materials which do not flow so easily, which have less diffusion and which are harder than gold.

The invention is based on the recognition that very advantageous use can be made of the very surprising, highly unexpected effect that the tip with a diameter of several nanometers does not break or wear when inserted in the hard material, but is even sharpened.

It is to be noted that the Article "Surface Modification in the Nanometer range by the Scanning Tunneling Microscope" in "Journ. Vac. Sci. Technology", A6(2) pp. 537-539 (1988) describes an experiment for providing deformations by means of the tip of a scanning tunneling microscope in a material harder than gold, namely in a metallic or metallized glass. In this experiment the negative feedback control loop for the tip height remains operative when the deformations are being provided. When the tip has arrived at a location where a deformation must be provided, the voltage between the tip and the surface is increased to two Volts, and moreover, the tunneling current is increased to approximately three hundred nA at which this current starts to oscillate. After approximately three seconds, the current is decreased again and it can be ascertained that a hillock having a diameter of 30 nm and a height of 15 nm has been formed. As an explanation of this phenomenon the Article states that a quantity of material has melted under the tip and that this material is drawn toward the tip due to a strong electric field between the surface and the tip, which electric field is also present while the molten material is being cooled. Both the method and the deformations obtained according to the invention are different from those described in the last-mentioned Article.

The method according to the invention is preferably further characterized in that the second electric control voltage is obtained by summing the instantaneous value which the first control voltage has at the instant when the negative feedback control loop is interrupted and a third voltage whose amplitude increases as a function of time and which has a predetermined final value.

Since the instantaneous value which the first control voltage has at the instant of starting the formation of a pit is maintained until after the formation of this pit, it is achieved that the tip reaches its reference level immediately after the formation of the pit.

In principle the method according to the invention may be used on numerous materials. A preferred embodiment of the method is further characterized in that the material is silicon. This material has a relatively great hardness and a sufficiently high electrical conductivity for realizing a tunneling current required for the control of the tip height.

In the Article in "Journ. Vac. Sci. Technology" A6(2) (1988), pp. 537-539 it is noted that lines can also be formed with the method described in this Article. However, these lines have an irregular geometry and are disturbed as a result of thermal drift. In contrast thereto the method according to the invention is well suited for providing lines or tracks in a surface if this method is further characterized in that a plurality of pits is provided in such a way that the mutual distance between their centers is smaller than the dimension of a pit in the scanning direction of the tip. The pits thus formed and merging with one another then constitute a track having a regular geometry. This method is extremely suitable for manufacturing surface structures having extremely small details which can no longer be manufactured by means of conventional methods. An important application of this method is in the field of manufacturing integrated circuits in which structures can be provided directly on a silicon substrate or are first provided on a mask which is subsequently copied on the substrate.

Because of the very small and well-defined pits which can be formed, an embodiment of the method according to the invention is extremely suitable for inscribing information in a record carrier. This embodiment is further characterized in that an electric signal representing the information to be inscribed is used for timecontrolling the movement of the tip in the scanning direction and for determining the instants when the tip height control loop is interrupted or closed, respectively, and between which instants the second control voltage is applied to the tip height drive member.

The record carrier inscribed by means of this method can be read with the same scanning tunneling microscope which is used for inscribing the information. During reading the microscope can be operated in the known manner, i.e. at a constant tunneling current. The variation of the control voltage for the Z drive member is representative of the signal which has been read. Under circumstances it is preferred to scan the inscribed area of the record carrier at a control voltage for the Z drive member which keeps the tip at a constant height above the plane of the record carrier surface. Such voltage will be called information-independent control voltage. When the Z drive member is controlled by such voltage the varying tunnel current represents the information which has been read. During scanning the tip is not moved in the Z direction except for following an eventual coarse slope of the record carrier surface and scanning can be performed with great speed.

It is to be noted that it is known per se from U.S. Pat. No. 4,575,822 to use a scanning tunneling microscope for reading information areas in a record carrier. This Patent describes in a relatively extensive manner how the information areas can be inscribed in the form of electrical charge packets between two layers of a multilayer record carrier. The patent also states that the information areas may have the shape of physical disturbances of the surface, which disturbances may be provided by physical contact between a so-called physical probe and the surface, but this is only a remark which is not further elaborated. For example, it has not been stated that the probe is the tip of the tunneling microscope. U.S. Pat. No. 4,575,822 does not reveal the idea to lower the tip into the record carrier surface in a defined way by means of a special control and making effective use of the surprising fact in which it is found that the tip does not wear.

The invention also relates to a new record carrier which has been inscribed by means of the method according to the invention. This record carrier, which like the known record carrier has information areas arranged in tracks in which the information is encoded in the succession of the information areas in the track direction, is characterized in that the information areas are pits in a surface, which pits have a uniform geometry with a surface area of less than 0.01 $\mu m^2$.

The uniform pits are, for example round with a diameter of 10 nm. This means that an information unit, or bit, of the new record carrier occupies a surface area of, for example $10 \times 10$ nm$^2$. For an optically readable record carrier, like the known "Compact Disc", it holds that an information bit occupies a surface area of approximately $1 \times 1$ $\mu m^2$. By using the present invention record carriers which have an information density which is of the order of 10,000 times larger than that of the known record carriers can thus be inscribed and read.

The invention also relates to a device for performing the novel way of deforming a surface. This device comprises a holder for holding the material to be machined, a thin conducting stylus, a first and a second drive member for moving the stylus and the holder with respect to each other in two mutually perpendicular directions parallel to the plane of the holder, a tip height drive member for adjusting the distance between the tip and the surface and an electronic negative feedback control loop for applying a first control voltage to the tip height drive member and is characterized by an electronic circuit having an input for receiving an electric signal which comprises information about a pattern to be provided on the surface, the circuit having a first and a second output for supplying a first and a second control signal, which outputs are connected to the first and the second drive member, and a third output for supplying a signal during given time intervals for temporarily interrupting the tip height control loop, and by a voltage source which supplies a second control voltage for the tip height drive member during the time intervals, the amplitude of the second control voltage increasing as a function of time to a predetermined final value which is larger than that of the first control voltage.

A preferred embodiment of this device is characterized in that the tip height control loop has a sample and hold circuit, a control input of which is connected to the third output of the electronic circuit, in that the output of the tip height control loop is connected to a first input of a summing device, a second input of which is connected to a voltage source which is synchronously controlled with the sample and hold circuit and which supplies a voltage having an increasing amplitude, and in that the output of the summing device is connected to the tip height drive member.

The invention also relates to an apparatus for inscribing and reading information in the form of a succession of information pits separated from one another in a record carrier surface, which apparatus is provided with the above-mentioned device for inscribing information. This apparatus is characterized in that its read section is constituted by the device in which the tip height drive member is controlled by only the first control voltage or an information-independent control voltage.

If the tip height drive member is controlled by the first control voltage, the variation of this voltage represents the information which has been read. When controlling this drive member with a constant control voltage, the variation of the tunneling current represents the information which has been read.

Figure 2:
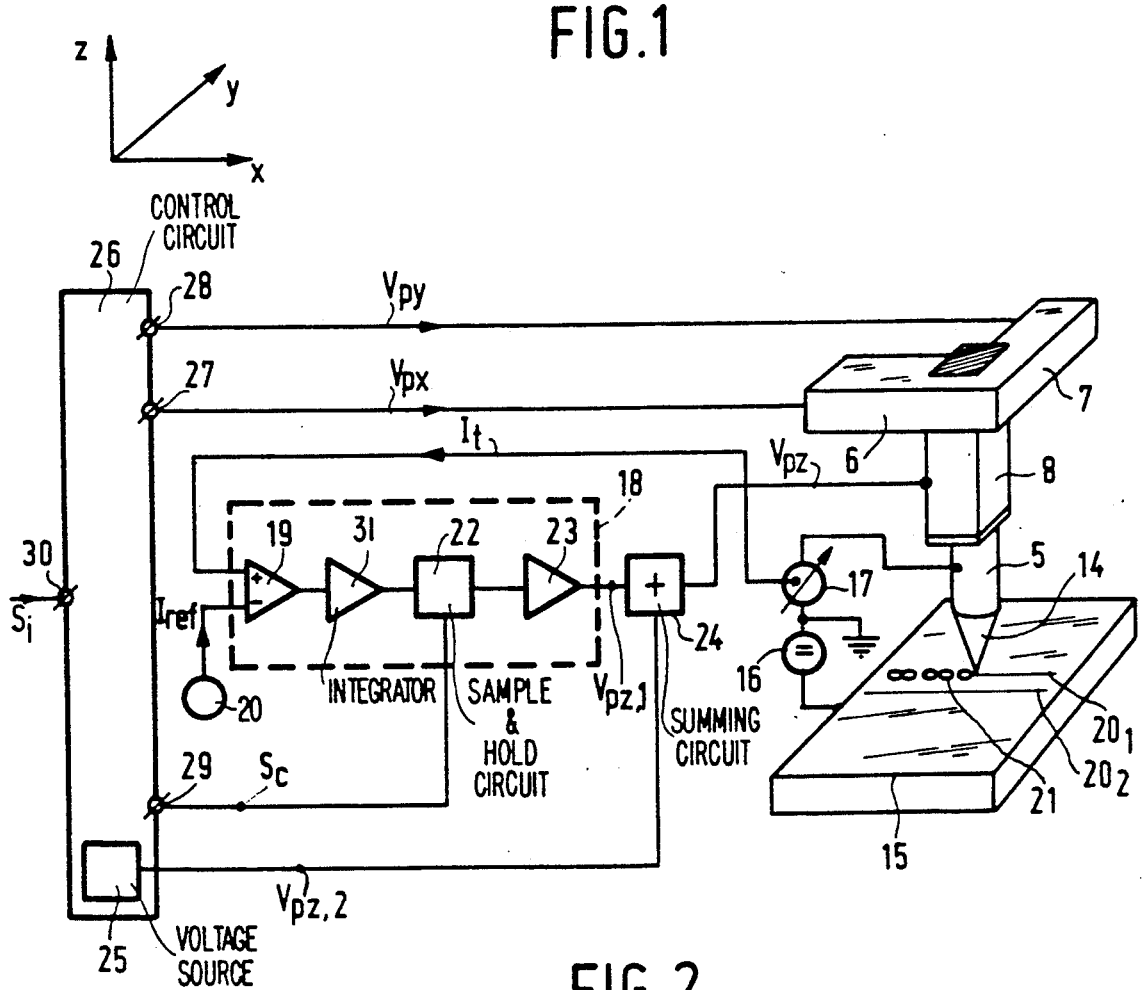
Figure 3A:
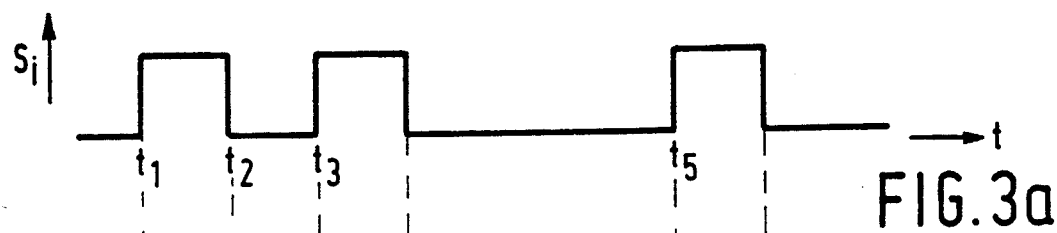
Figure 3B:
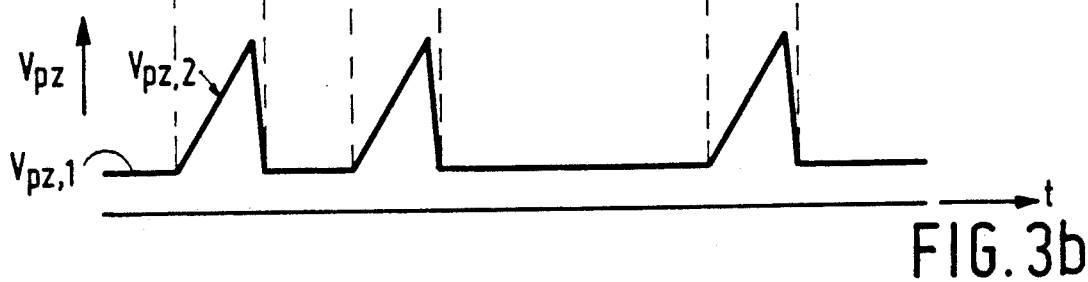
Figure 3C:
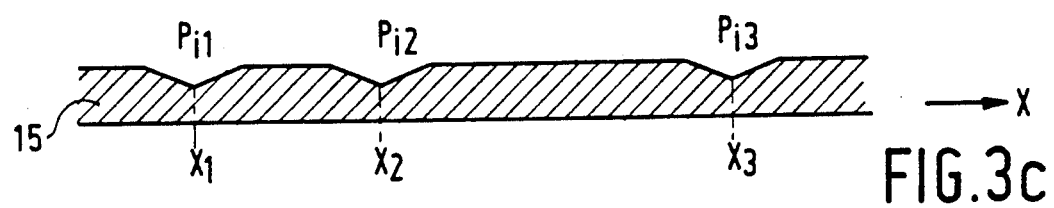
Figure 4A:
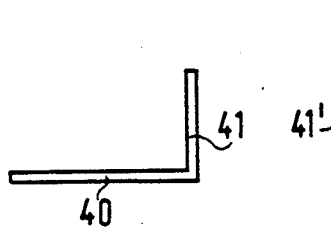
Figure 4B:
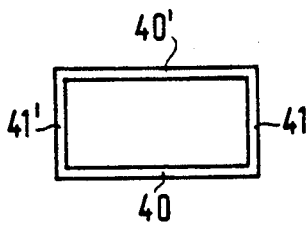
Figure 4C:
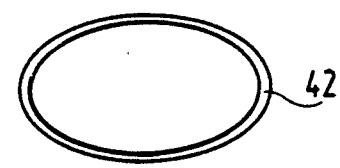
Figure 5:
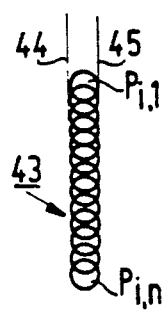

The invention will now be described in greater detail with reference to the accompanying drawings in which FIG. 1 shows the principle of a known scanning tunneling microscope, FIG. 2 shows diagrammatically an embodiment of a device according to the invention, FIGS. 3a, 3b and 3c show the variation of an information signal presented to the device for inscribing information and the associated control voltage of the tip height drive member, both as a function of time, and the associated pits in the record carrier, FIGS. 4a, 4b and 4c show different patterns which can be provided in a surface according to the invention, and FIG. 5 shows the structure of a track formed in accordance with the invention in a surface.

For a better understanding of the present invention a brief description will first be given of the principle of the known scanning tunneling microscope which is used for studying surfaces. The block diagram of FIG. 1 shows the essential components of such a microscope which has been described extensively in, for example U.S. Pat. No. 4,343,993.

In FIG. 1 the reference numeral 15 denotes an object to be examined which is arranged on a table or holder 4. A conducting stylus 5 having a very fine tip is arranged over this object and functions as a first electrode. The object 15 which is also conducting constitutes a second electrode. For the sake of clarity the two electrodes are shown in an exaggerated size. The tip and the object can be moved with respect to each other in three mutually perpendicular directions, which is denoted diagrammatically by the system of coordinates XYZ. To this end the microscope has a composite positioning system comprising three independently drive actuators or drive members 6, 7 and 8. These drive members preferably comprise piezoelectric elements with which minimum movements of the order of hundredths of a nanometer can be realized. The drive members 6 and 7 more the tip 14 and the table 4 with respect to each other in the X and Y directions. These elements may move the table with respect to the tip but preferably the tip is moved with respect to the table. The distance between the tip and the surface, in the Z direction, can be adjusted by means of the piezoelectric drive member 8. The drive member 8 may be connected to the stylus 5 for moving this stylus with respect to the table 4. The drive member 8 may also be connected to the table 4 for moving this table with respect to the stylus 5. The stylus is electrically insulated from the drive members 6, 7 and 8.

The stylus 5 with the drive members and the table with the material 15 may be arranged in a chamber 1 in which a high vacuum can be realized by means of a vacuum pump 2. This chamber may further be maintained at a low temperature by means of a cooler 3, for example a cryogenic cooler. A scanning tunneling microscope may, however, also be operated in air without any vacuum and cooling.

The tunneling microscope further comprises an electronic control and measuring circuit 9. This circuit supplies the control voltages for the X and Y drive members 6 and 7 and measures the displacments which are brought about by these drive members. The circuit 9 also supplies a control voltage for the Z or tip height drive member in such a way that the tip is placed so close to the surface, for example at a distance of the order of 0.1 to 1 nm, that electrons can travel between the tip and the surface if a voltage, referred to as tunneling voltage in this specification, is applied between the tip and the surface. This voltage is supplied by the control and measuring circuit 9 as is shown in FIG. 1.

Since the tunneling current is greatly dependent on the distance between the tip and the surface, the Z adjustment of the tip should be carried out with great accuracy, for example at an accuracy of 0.01 nm in order to obtain a sufficient resolution.

When examining surfaces the tunneling microscope may be operated in various modes, for example with a constant tunneling current or with an information-independent Z control voltage. A description of the first-mentioned mode may provisionally suffice. When applying a constant tunneling voltage, a tunneling current starts to flow if the distance between the tip 4 and the surface is sufficiently small. As long as the tip scans a flat portion of the surface, the tunneling current remains constant. However, if the tip moves across a deformation, for example a pit or a hillock, the tunneling current tends to change considerably due to the change in distance between the tip and the surface. However, the tunneling current is measured in the electronic circuit 9 and compared with a reference current generated in this circuit, which reference current is representative of the desired height of the tip above the surface. The result of this comparison is applied in the form of an electric signal to a control circuit 10 for the Z drive member. It corrects the height of the tip in such a way that the tunneling current remains equal to the reference current. The Z movement of the tip is determined by way of the signal applied to the Z drive member. From this information, together with the information about those X and Y positions of the tip for which such changes in Z position occur, a "tunneling image" of the scanned surface can be composed in a signal processing unit 11, which image can be visualized by means of a scriber 12 or a display screen 13.

According to the invention surface deformations with a constant and very accurately determined geometry can be provided in the surface by lowering the tip of the described tunneling microscope into this surface.

FIG. 2 shows diagrammatically a modified tunneling microscope with which this method can be performed. In this Figure the reference numeral 15 again denotes the surface in which deformations, for example information areas 21, must be provided and the reference numeral 14 denotes the tip of the conducting stylus 5 which is secured to the positioning system. This system comprises, for example three separate piezoelectric elements 6, 7 and 8 which may have different shapes, or it may comprise a single piezoelectric element, for example in the form of a cylinder on which different electrode pairs for the different directions of movement are arranged. By variation of the control voltages Vpx, Vpy and Vpz applied to the drive members 6, 7 and 8 the lengths of these elements can be varied so that the tip 14 can be moved in the X, Y and Z directions with respect to the surface 15.

After the material to be machined is arranged on the table 4, a presetting device (not shown) ensures that the tip is directed to a given XY starting position on the surface. Moreover, the tip is arranged at a very short distance from this surface. If the voltage source 16 supplying a tunneling voltage in the form of a direct voltage of, for example, 1 Volt is connected to the stylus and the surface, a tunneling current starts to flow which can be measured by means of the current sensor 17. The surface can then be scanned while maintaining a constant distance between the tip and the surface. To this end the machining device has a control circuit 18 which forms part of the circuit 9 of FIG. 1.

The control circuit 18 comprises a differential amplifier 19 a first input of which receives the tunneling current $I_t$. A reference current Iref which is proportional to the desired distance between the tip and the surface and which is supplied by a reference source 20 is applied to the second input of this amplifier. The output signal of the amplifier 19 can pass through an integrator 31 before it is applied as a control voltage Vpz, 1 to the Z drive member 8. A high-voltage amplifier 23 may be arranged in the control circuit.

When inscribing information in the form of uniform pits 21, a line $20_1$ in the X direction is scanned first, subsequently a second line $20_2$ is scanned, and so forth until all information has been inscribed. The scanning movement in the X direction is not continuous but is each time interrupted at those instants which correspond to given X positions where an information area must be formed. This discontinuous X scanning movement is controlled by a processing signal reception and control circuit 26 which supplies a control voltage Vpx from its output 27. A signal Si comprising the data about the pattern which must be provided on the surface 15 is applied to the input 30 of the electronic circuit 26. With the aid of these data it is determined in the circuit 26 which movements the drive members 6, 7 and 8 must perform as a function of time and control voltages for the drive members 6 and 7, Vpx and Vpy, and a switching signal Sc are generated which appear at the outputs 27, 28 and 29.

FIG. 3a shows an example of a small portion of a digital signal which must be inscribed. This signal comprises a plurality of standard pulses having a pulse duration T at varying mutual time intervals. The time axis t of the signal Si is coupled via the circuit 26 to the movement of the tip in the X direction. At the instant t1 the movement of the stylus is stopped and the tip must be lowered into the material. The switching signal Sc is used for this purpose. This signal deactivates the negative feedback control circuit 17, 18. The drive member 8 is also energized with a control voltage Vpz, which differs from Vpz, 1 in such a way that the tip 14 is moved downwards over a distance which is larger than the tunneling distance, i.e. the tip-to-surface distance at which a tunneling current can occur.

This movement can be realized by interrupting the connection between the output of the control circuit and the drive member 8 so that the voltage Vpz,1 is no longer applied to the Z drive member and by energizing this drive member with a defined voltage having an amplitude increasing as a function of time with a predetermined final value.

However, the downward movement of the tip is preferably realized by means of the circuit 18 and a summing device 24 shown in FIG. 2. As compared with the circuit 9 of FIG. 1 the control circuit 18 of FIG. 2 comprises a sample and hold circuit 22 as an extra element. This circuit is switched on by the switching signal Sc and has a constant output voltage from the moment of switching on ($t_1$, $t_3$, $t_5$ FIG. 3a) which output voltage is equal to the instantaneous value which the control voltage Vpz,1 has at the switch-on instant. The output voltage of the circuit 22 is applied to a summing device 24 to which also the signal from an extra voltage source 25 is applied. The voltage source 25 supplies a voltage whose amplitude increases as a function of time. This voltage source is switched on and off synchronously with switching on and switching off the signal Sc. The new control voltage Vpz=Vpz,1+Vpz,2 ensures that the tip is moved downwards and is lowered into the material. At the instant t2 the voltage pulse Vpz,2 ends. Then the tip is retracted again. The sample and hold circuit 22 is also switched off so that the control loop 18 for the drive member 8 is activated again. As a result the distance between the tip and the local surface portion will be exactly the same as it was before deactivating the control loop 17, 18. Its great advantage is that for each pit formation the downward movement of the tip is started from the same relative Z position of the tip with respect to the surface so that with the same final value of the voltage Vpz,2 the tip is always pressed equally deeply into the material.

After the tip has been retracted, a pit which is stable in time remains in the surface. The geometry of such a pit is determined by the final value of the voltage Vpz,2 and the geometry of that portion of the tip which has been pressed into the material. Since, as has surprisingly been proved, the tip does not wear when it is pressed into the material, it is in principle possible to form a large number of pits of the same geometry.

FIG. 3c shows diagrammatically several pits $Pi_1$, $Pi_2$ $Pi_3$ which are formed in the manner described above at the positions $X_1$, $X_2$ and $X_3$. These positions are related to the instants at which the speed in the scanning direction of the tip has become zero, which instants are related to the instants $t_1$, $t_3$ and $t_5$, respectively, in the supplied information signal Si. FIG. 3b shows the control voltage Vpz during the time interval in which the series of pits is inscribed, which voltage is composed of voltage components Vpz, 2 alternating with voltage components Vpz,1.

The surface area of the information areas formed may be of the order of 10,000 times smaller than that of the smallest information areas hitherto known, i.e. those of optical record carriers, so that an increase of the information density on a record carrier by a factor of the order of 10,000 can be achieved by using the invention. In an experimental set-up round pits with a diameter of approximately 5 nm were formed, which pits were surrounded by a ridge of material pressed out of the pit, which ridge had a width of approximately 5 nm too so that the effective diameter of the non-overlapping pits was approximately 15 nm. The pits had a depth of the order of 1 nm.

After the pits have been inscribed, they can be read with the same tunneling microscope as is shown in FIG. 2, both during the inscribing process for control purposes and at a later stage when the inscribed information is needed to process it. During reading, the sample and hold circuit 22 is inactive and no extra voltage Vpz, 2 is used. Reading can be carried out with a tunneling current which is held constant, the variation of the control voltage Vpz,1 representing the information which has been read. However, it is also possible to scan with an information-independent control voltage Vpz when reading an inscribed part of the record carrier, which part has already been scanned during inscribing and whose roughness may therefore be known. The variation of the tunneling current then represents the information which has been read.

The fact that the signal which can be inscribed in the record carrier and read from this record carrier is a digital signal does not mean that the information itself may be exclusively digital data coming from or intended for, for example a computer. In principle the record carrier is suitable for storing all kinds of information such as a video and/or audio program, graphic representations, X-ray images, and the like, provided that this information can be digitized.

Instead of a pattern of pits it is also possible to provide continuous, straight or curved tracks, some examples of which are shown in FIGS. 4a, 4b and 4c, in the surface by means of the method according to the invention. This provides the possibility of direct material machining on hitherto unprecedented scale, namely in the nanometer range. An important application is the direct provision of structures in semiconductor materials, such as silicon so that the cumbersome photolithographic process no longer needs to be used in the manufacture of integrated circuits. The invention may also be used in the manufacture of masks for X-ray lithography. The method according to the invention may not only be considered as an alternative to fine mechanical machining operations but also as an addition to this, because much finer structures can be realized by means of this method.

When providing continuous tracks in the surface, the tip is moved in the scanning direction in between the formation of two pits over a distance which is smaller than the dimension of the tip in the scanning direction. The pits formed then merge with one another to a greater or lesser extent as is shown in FIG. 5. The smoothness of the edges 44 and 45 of the track 43 is determined by the overlap of the successive pits $Pi_1 \ldots Pi_n$. The track formed has a constant depth throughout its length because the Z position of the tip is adjusted to the reference level each time before a subsequent pit is provided.

Tracks having arbitrary shapes can be realized by adapting the X and Y control of the tip. For forming the pattern according to FIG. 4a the tip first moves over a given distance in the X direction with a constant Y position for forming the pattern portion 40 and then it moves over a given distance in the Y direction with a constant X position for forming the pattern portion 41. For forming the pattern according to FIG. 4b this movement is repeated in reverse directions. The elliptical shape 42 of the pattern according to FIG. 4c is realized while simultaneously controlling the X and Y positions of the tip.

Particularly when inscribing the very small information areas in a record carrier, it must be ensured that the surface is sufficiently smooth so that the inscribed information can also be retraced and is not hidden between irregularities which may already be present in the uninscribed surface. The required, for example atomic smoothness is realized in, for example the so-called terraces of a silicon (100) surface. These terraces must have a minimum longitudinal dimension of at least twice and preferably a larger number of times the pit length.

It has been found that eminent results can be achieved with a combination of a tungsten tip and the material silicon (100) which is slightly contaminated with nickel. Besides the surface of a crystalline silicon substrate, also a silicon containing amorphous layer provided on a crystalline silicon substrate can also be deformed by means of the method according to the invention. The advantage of silicon is that it is present in large quantities in nature and in principle it is therefore an inexpensive material. Moreover, it is the raw material which is most frequently used for integrated circuits and much technological experience has been gained with it so that integration of a silicon pit memory with other silicon structures such as integrated circuits may also be considered.

When inscribing and reading a silicon pit memory, operations must be carried out in a vacuum chamber as is shown in FIG. 1. Modification and subsequent inspection or reading these modifications by means of a tunneling microscope may, however, also be carried out in air. Then, however, an inert material which flows less and which is harder than gold must be used.

I claim:

1. A method of deforming a surface on a sub-micron scale by using a tip of a scanning tunneling microscope (STM) comprising the steps of
    a) moving a tip of a STM in a pattern in a scanning direction in a plane parallel to a surface of an object to form a processing pattern on said surface;
    b) holding said tip at a reference level above said surface upon moving said tip in said pattern by applying a first electrical control voltage to a tip height driving arrangement, said reference level being at a constant distance from said surface;

c) supplying voltage to said tip height driving arrangement through a negative feedback control loop, said negative feedback control loop being controlled by a tunneling current resulting from a constant tunneling voltage applied between said tip and said surface;

d) deforming said surface by the substeps of
   (i) interrupting said negative feedback control loop,
   (ii) energizing said tip height driving arrangement with a second electrical control voltage,
   (iii) increasing amplitude of said second electrical control voltage as a function of time to lower said tip from said reference level into said surface to a defined level, and
   (iv) producing a pit in said surface with said tip at said defined level, said pit having an accurately defined geometry;

e) thereafter retracting said tip to said reference level above said surface by switching-on said negative feedback control loop; and f) then repeating said steps (c)–(e) to form subsequent pits in said pattern in said surface.

2. A method according to claim 1, wherein said second electrical control voltage in said step (d)(ii) is formed by summing an instantaneous value of said first electrical control voltage at an instant of interrupting said negative feedback control loop and a third voltage, said third voltage having an amplitude increasing with time, and said third voltage having a predetermined final value.

3. A method according to claim 2, wherein said object is formed with a surface layer of silicon.

4. A method according to claim 2, wherein said step (f) is carried out to form a plurality of pits having a mutual distance between centers smaller than a dimension of each pit in said scanning direction of said tip.

5. A method according to claim 2, further comprising a step of inscribing information in a record carrier, wherein an electric signal representing said information is used for time-controlling movement of said tip in said scanning direction, and said electric signal is used for determining instants of interrupting said negative feedback control loop in said step (d)(i), and wherein said step (d)(ii) is carried out between said instants.

6. A method according to claim 1, wherein said object is formed with a surface layer of silicon.

7. A method according to claim 1, wherein said step (f) is carried out to form a plurality of pits having a mutual distance between centers smaller than a dimension of each pit in said scanning direction of said tip.

8. A method according to claim 1, further comprising a step of inscribing information in a record carrier, wherein an electric signal representing said information is used for time-controlling movement of said tip in said scanning direction, and said electric signal is used for determining instants of interrupting said negative feedback control loop in said step (d)(i), and wherein said step (d)(ii) is carried out between said instants.

9. An apparatus for deforming a surface on a submicron scale comprising
   a) holding means for holding an object having a surface,
   b) a thin conducting stylus having a tip,
   c) first and second drive means for respectively moving said stylus and said holding means relative to one another in two mutually perpendicular directions parallel to a plane of said surface,
   d) tip height driving means for adjusting distance between said tip and said surface,
   e) negative feedback control loop means for applying a first control voltage to said tip height driving means,
   f) electronic circuit means including
      (i) input means for receiving an electrical signal, said electrical signal providing information about a pattern to be provided on said surface,
      (ii) first and second output means for respectively supplying a first and a second control signal, said first and second output means being connected respectively to said first and second drive means, and
      (iii) third output means for supplying a signal to temporarily interrupt said negative feedback control loop means during given time intervals, and
   g) voltage source means for supplying a second control voltage to said tip height driving means during said given time intervals, said second control voltage having an amplitude increasing with time to a predetermined final voltage value, said final voltage value being larger than said first control voltage.

10. An apparatus according to claim 9, wherein said negative feedback control loop means includes a sample and hold circuit having a control input connected to said third output means, wherein said negative feedback control loop means includes an output connected to a first input of a summing circuit, said summing circuit having a second input connected to said voltage source means, said voltage source means being synchronously controlled with said sample and hold circuit, and wherein said summing circuit has an output connected to said tip height driving means.

11. An apparatus for inscribing and reading information from a record carrier surface comprising
   a) a record carrier having a surface for disposing a succession of separated information pits; and
   b) a device for inscribing information in the form of said succession of separated information pits, said device comprising
   c) holding means for holding an object having a surface,
   d) a thin conducting stylus having a tip,
   e) first and second drive means for respectively moving said stylus and said holding means relative to one another in two mutually perpendicular directions parallel to a plane of said surface,
   f) tip height driving means for adjusting distance between said tip and said surface,
   g) negative feedback control loop means for applying a first control voltage to said tip height driving means,
   h) electronic circuit means including
      (i) input means for receiving an electrical signal, said electrical signal providing information about a pattern to be provided on said surface,
      (ii) first and second output means for respectively supplying a first and a second control signal, said first and second output means being connected respectively to said first and second drive means, and
      (iii) third output means for supplying a signal to temporarily interrupt said negative feedback control loop means during given time intervals, and i) voltage source means for supplying a second control voltage to said tip height driving means during said given time intervals, said second control voltage having an amplitude increasing with time to a predetermined final voltage value, said final voltage value being larger than said first control voltage;

wherein said device includes reading means for reading the inscribed information, said reading means controlling said tip height driving means by one of said first control voltage or a control voltage being independent of information on said surface.

12. An apparatus according to claim 11, wherein said negative feedback control loop means includes a sample and hold circuit having a control input connected to said third output means, wherein said negative feedback control loop means includes an output connected to a first input of a summing circuit, said summing circuit having a second input connected to said voltage source means, said voltage source means being synchronously controlled with said sample and hold circuit, and wherein said summing circuit has an output connected to said tip height driving means.

* * * * *